US007741920B2

(12) United States Patent
Westra (10) Patent No.: US 7,741,920 B2
(45) Date of Patent: Jun. 22, 2010

(54) QUADRATURE OSCILLATOR WITH SIMPLIFIED AMPLITUDE, PHASE AND FREQUENCY CONTROL

(75) Inventor: Jan R. Westra, Uithoorn (NL)

(73) Assignee: Broadcom Corporation, Irvine, CA (US)

( * ) Notice: Subject to any disclaimer, the term of this patent is extended or adjusted under 35 U.S.C. 154(b) by 31 days.

(21) Appl. No.: 11/350,755

(22) Filed: Feb. 10, 2006

(65) Prior Publication Data

US 2007/0188248 A1 Aug. 16, 2007

(51) Int. Cl.
*H03B 5/02* (2006.01)
(52) U.S. Cl. ............... 331/36 C; 331/135; 331/153
(58) Field of Classification Search .......... 331/135, 331/136, 182, 183, 36 C, 55, 57, 111, 143, 331/153; 327/554
See application file for complete search history.

(56) References Cited

U.S. PATENT DOCUMENTS

| | | | | |
|---|---|---|---|---|
| 4,988,900 A | * | 1/1991 | Fensch | 327/337 |
| 5,175,452 A | * | 12/1992 | Lupi et al. | 327/262 |
| 5,481,227 A | * | 1/1996 | Komori et al. | 331/2 |
| 5,764,100 A | * | 6/1998 | Callicotte et al. | 327/554 |
| 5,847,617 A | * | 12/1998 | Reddy et al. | 331/57 |
| 6,225,872 B1 | | 5/2001 | Verhoeven | |
| 6,356,160 B1 | * | 3/2002 | Robinson et al. | 331/17 |
| 6,369,661 B1 | * | 4/2002 | Scott et al. | 331/45 |
| 6,377,646 B1 | | 4/2002 | Sha | |
| 6,452,430 B1 | * | 9/2002 | Tung et al. | 327/156 |
| 6,608,504 B2 | * | 8/2003 | Fujimoto | 327/94 |
| 6,959,217 B2 | | 10/2005 | DelMain et al. | |
| 7,268,635 B2 | * | 9/2007 | Meltzer | 331/57 |
| 7,330,081 B1 | * | 2/2008 | Asa et al. | 331/57 |
| 7,414,482 B2 | | 8/2008 | Westra | |
| 2006/0269014 A1 | * | 11/2006 | Li | 375/327 |
| 2007/0024385 A1 | | 2/2007 | Greenberg | |
| 2007/0188247 A1 | | 8/2007 | Westra | |

OTHER PUBLICATIONS

Verhoeven et al., "Low-noise Oscillators", *Analog Circuit Design*, Kluwer Academic Publishers 1996, The Netherlands, pp. 65-85.
Westra et al., "Resonance-mode selection and Crosstalk Elimination Using Resonator-Synchronised Relaxation Oscillators", ESSCIRC 1998, The Hague, The Netherlands, pp. 88-91.

* cited by examiner

*Primary Examiner*—Robert Pascal
*Assistant Examiner*—Levi Gannon
(74) *Attorney, Agent, or Firm*—Sterne, Kessler, Goldstein & Fox P.L.L.C.

(57) ABSTRACT

An oscillator circuit providing quadrature outputs and enabling instantaneous control over phase, frequency and amplitude of the output waveforms is disclosed. In one embodiment, the oscillator circuit comprises an oscillation loop, at least one capacitor switching circuit coupled to the oscillation loop, and a synchronization signal having an output coupled to the at least one capacitor switching circuit. The synchronization signal may be derived internally from the oscillation loop or externally from an external oscillator.

19 Claims, 10 Drawing Sheets

QUADRATURE OSCILLATOR WITH SIMPLIFIED AMPLITUDE, PHASE AND FREQUENCY CONTROL

CROSS REFERENCE TO RELATED APPLICATIONS

This application is related to co-pending patent application Ser. No. 11/350,731, entitled "Resonance Mode Selection Using a Resonator Synchronized Second Order Oscillator" by Jan R. Westra, which application is incorporated herein by reference in its entirety.

BACKGROUND OF THE INVENTION

1. Field of the Invention

The present invention relates generally to oscillators, and more specifically to oscillators having amplitude, phase and frequency control.

2. Background Art

Many electronic systems, such as systems for communication or measurements, need stable time references. These time references are often implemented as electronic oscillating circuits, or oscillators. These oscillators generally produce periodic waveforms as an output voltage, current, charge or other electrical variable that can be used as a time reference. In many cases, these output periodic waveforms are sinusoidal, triangular, sawtooth or square waveforms.

Depending on the exact application, the need can exist for a quadrature output signal, a signal that is ±90 degrees out of phase with the first output signal. Moreover, there can be a need to change the amplitude, phase or frequency of the electrical oscillation. Furthermore, a desired feature of oscillators is that they can easily be integrated in integrated circuits in standard processes, consuming as low power as possible to prevent the need for a blower or heat sink on the integrated circuit, or even enabling integration at all.

Figure 1:
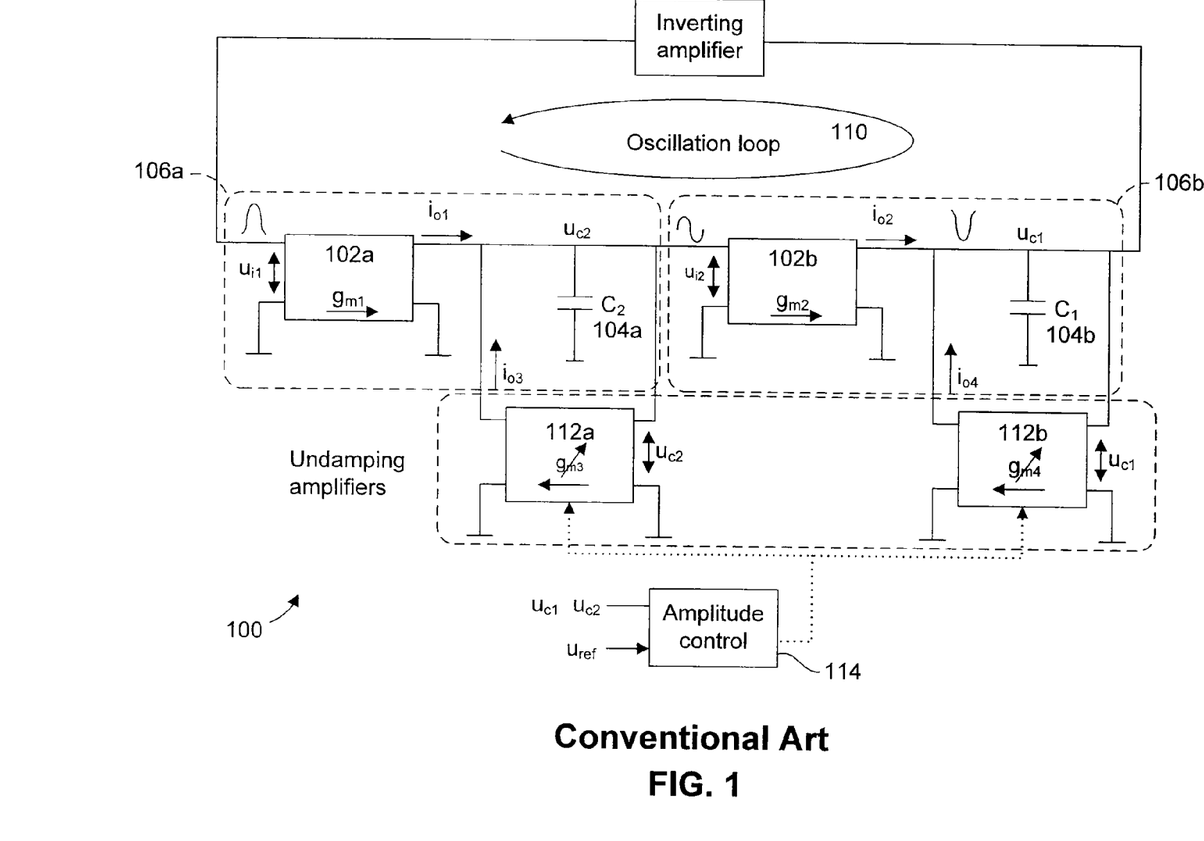
FIG. 1 illustrates a well-known prior art two-integrator oscillator.

Referring now to FIG. 1, there is shown one example of a well-known prior art two-integrator oscillator 100. The prior art oscillator comprises two transconductance amplifiers, 102a and 102b, with inputs $u_{i1}$ and $u_{i2}$, and output $i_{o1}$ and $i_{o2}$ respectively. The output currents of the two transconductors, 102a and 102b, are fed into capacitors $C_2$ (104a) and $C_1$ (104b) respectively, thus creating two voltage in—voltage out integrators, 106a and 106b. These two integrators each create a 90 degree phase shift. To complete the necessary 360 degrees of phase shift in the oscillation loop, an inversion is implemented between the output of the second integrator and the input of the first. In FIG. 1, this inversion is created by the inverting amplifier 108. In a fully differential version of the prior art oscillator, this inversion can also be created by swapping the positive and negative terminals of one the integrators in the loop.

One problem with such prior art two-integrator oscillators is the signal energy losses inside the oscillation loop 110. Losses may occur, for example, inside the transconductance amplifiers or may be caused by capacitor non-idealities, such as parasitic loss resistances. In order to sustain oscillation, these signal energy losses need to be compensated.

One solution in the prior art for compensating for such signal energy losses inside the oscillation loop 110 is to use transconductance amplifiers. Referring again to FIG. 1, there are shown two undamping transconductance amplifiers $g_{m3}$ and $g_{m4}$, 112a and 112b, which are used to compensate for the signal energy losses inside the oscillation loop 110. The two undamping amplifiers, 112a and 112b, are controlled by an amplitude control circuit, 114, that compares the amplitude of the oscillation inside the loop 110 to a desired reference value and controls the two undamping transconductance amplifiers, 112a and 112b, to compensate for the signal energy losses inside the loop. As a result, the oscillation loop 110 will sustain oscillation at the frequency where the loop gain is equal to 1 and the total phase shift in the loop is equal to 360 degrees. In the prior art oscillator of FIG. 1, the oscillation frequency $\omega_0$ is given by the equation:

$$\omega_0 = \sqrt{\frac{g_{m1} g_{m2}}{C_1 C_2}}$$

The transconductances $g_{m1}$ (102a) and $g_{m2}$ (102b) of the two-integrator oscillator may be defined by the equation:

$$g_{m1} = g_{m2} = g_m$$

and capacitors $C_1$ (104b) and $C_2$ (104a) are given by:

$$C_1 = C_2 = C$$

In this case, the oscillation frequency $\omega_0$ is defined by the equation:

$$\omega_0 = \frac{g_m}{C}$$

In the prior art architecture depicted in FIG. 1, the frequency and amplitude of the oscillation can be controlled independently. The frequency of the oscillation is determined by the value of the capacitors $C_1$ (104b) and $C_2$ (104a) and the transconductances $g_{m1}$ (102a) and $g_{m2}$ (102b), while the amplitude of the oscillation is controlled by the two undamping amplifiers, 112a and 112b, together with the amplitude control circuit 114.

Figure 2:
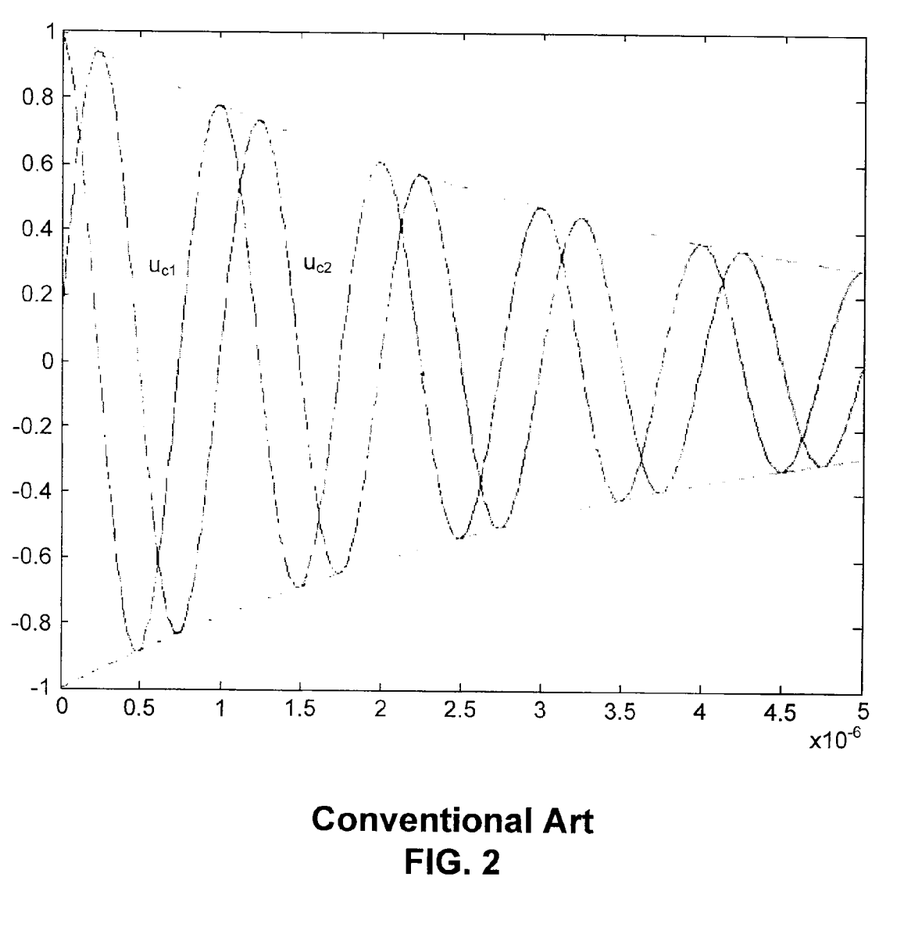
FIG. 2 illustrates voltage waveforms for the prior art two-integrator oscillator.

When no amplitude control loop is present, dissipation of the signal energy inside the amplifiers, or in lossy capacitors, causes the initial amplitude of the oscillation to decay exponentially. In such a case, the output signal of the circuit is determined by the initial voltages across the capacitors, 104a and 104b. Referring now to FIG. 2, there is shown the exponential decay of the waveforms for voltages $u_{i1}$ and $u_{i2}$ when an initial voltage of 1V is present across $C_1$ (104b) and an initial voltage of 0V is present across $C_2$ (104a).

Another disadvantage of the prior art two-integrator oscillator is the complex circuitry required to control the amplitude, phase and frequency. Such complex solutions can be difficult to design, unstable in operation and expensive to manufacture. Yet another disadvantage of the prior art oscillator in FIG. 1 is that phase control and phase locking is not possible.

Therefore, what is needed is an oscillator in which amplitude, phase and frequency can be easily controlled without the problems in the prior art.

BRIEF SUMMARY OF THE INVENTION

The present invention comprises a system and method, such as an oscillator circuit or a capacitor switching circuit, substantially as shown in and/or described in connection with at least one of the figures, as set forth more completely in the claims.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known processes and steps have not been described in detail in order not to unnecessarily obscure the present invention.

The present invention generally pertains to an oscillator circuit providing quadrature outputs and enabling instantaneous control over phase, frequency and amplitude of the output waveforms. In order to achieve these features, a capacitor switching circuit is introduced that can switch between two or more capacitors for $C_1$ of the prior art oscillator in FIG. 1 and two or more capacitors for $C_2$ of the prior art oscillator in FIG. 1.

Figure 3:
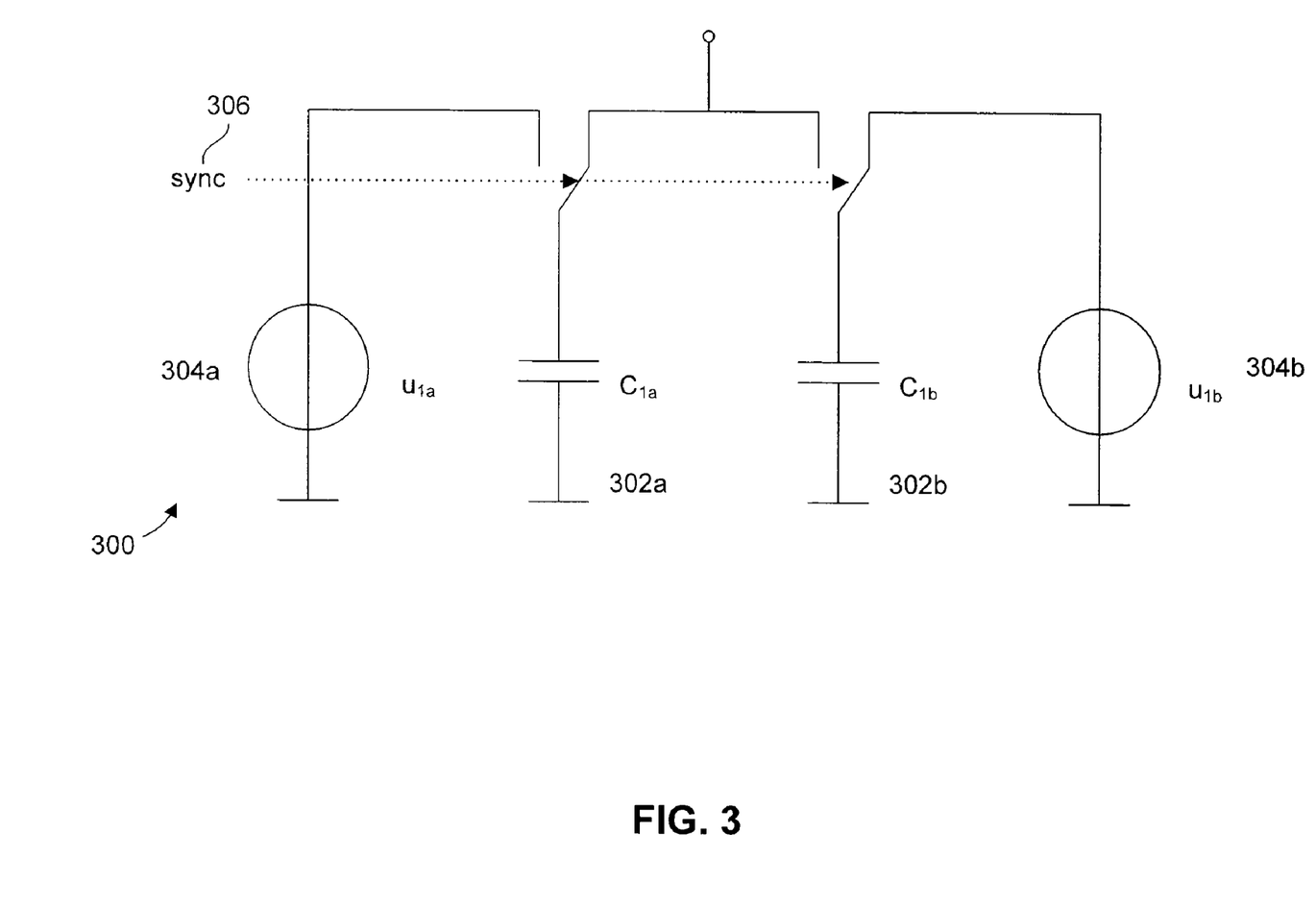
FIG. 3 illustrates a capacitor switching circuit in accordance with one embodiment of the present invention.

Referring now to FIG. 3, there is shown a capacitor switching circuit 300 in accordance with one embodiment of the present invention. In this embodiment, the capacitor switching circuit 300 replaces the original capacitors $C_1$ (104b) and $C_2$ (104a) of the prior art oscillating circuit in FIG. 1. The capacitor switching circuit 300 comprises a first capacitor, 302a, coupled to a first reference source, 304a, and a second capacitor, 302b, coupled to a second reference source, 304b. The reference sources, 304, can be a DC source or they can also be a signal reference source, like a square wave source. The capacitor switching circuit 300 may also include a synchronization signal sync 306 coupled to the circuit.

The capacitor switching circuit 300 switches between two capacitors on the command of the synchronization signal sync 306. When capacitor a (302a) is switched to the output of the circuit and takes part in the oscillation, capacitor b (302b) is switched to the output of a reference source 304b, and charges capacitor b (302b) to a predefined voltage.

One skilled in the art will realize that the present invention is not limited to two reference sources, but that the present invention may also be used with only one reference source or that the reference sources may be combined. For example, when both reference sources are DC sources having the same value, only one source may be required. Alternatively, when two DC sources are required, it may be replaced by one, for example, square wave modulated source.

Figure 4:
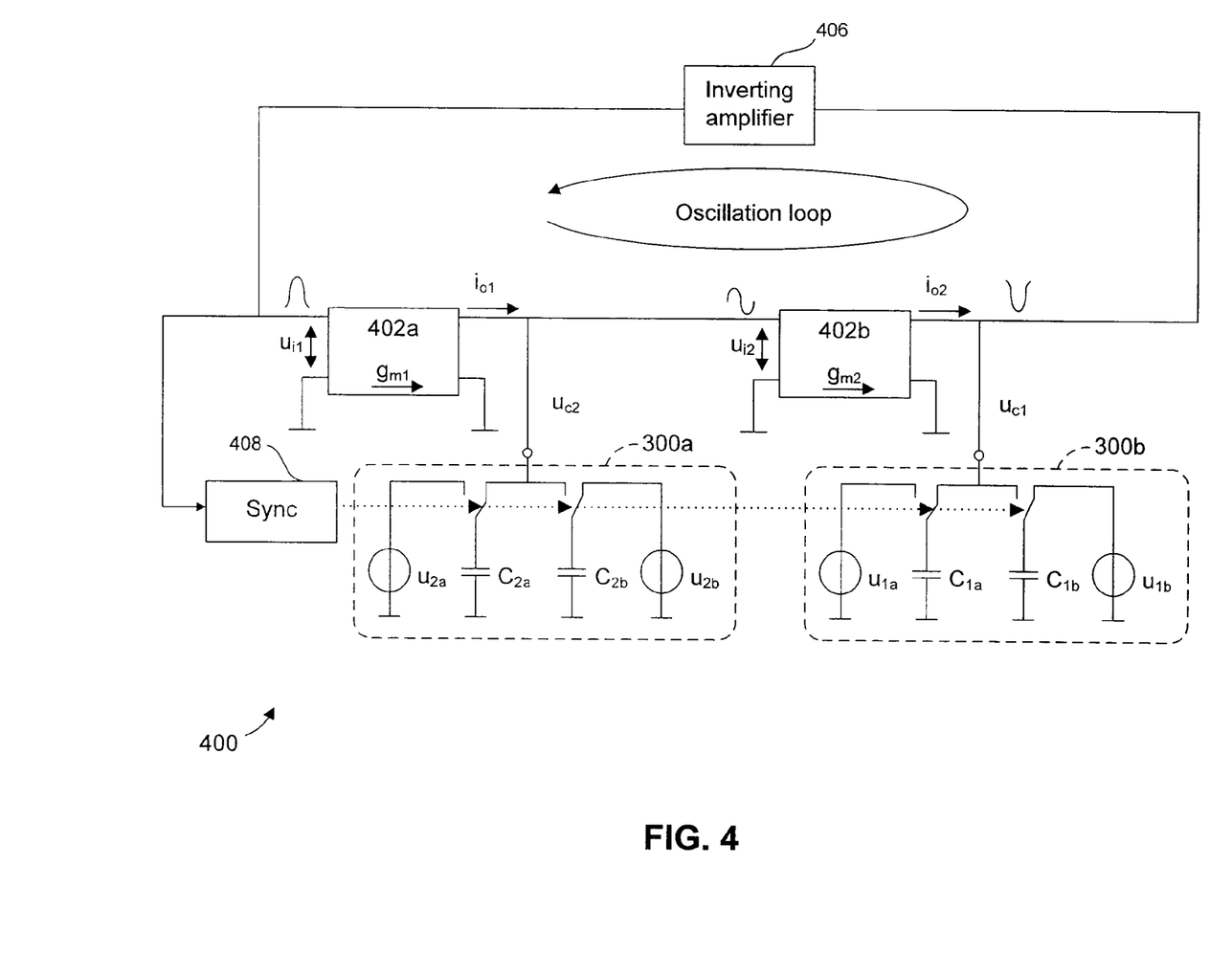
FIG. 4 illustrates a simplified schematic of an oscillator in accordance with one embodiment of the present invention.

Referring now to FIG. 4, there is shown an oscillating circuit 400 in accordance with one embodiment of the present invention. The oscillator architecture of the present invention comprises a first and second transconductance amplifier, 402a and 402b, and a first and second capacitor switching circuit, 300a and 300b, coupled to an output of the first and second transconductance amplifiers, 402a and 402b. The circuit 400 further comprises an inverting amplifier 406 and a synchronization signal sync 408.

In the present invention, the undamping amplifiers, 112a and 112b, and amplitude control circuit 114 of the prior art oscillator shown in FIG. 1 are removed, and the prior art capacitors, 104a and 104b, are both replaced by the capacitor switching circuit, 300a and 300b, as depicted in FIGS. 3 and 4. The capacitor switching circuits, 300a and 300b, switch between the two capacitors on the command of the synchronization signal sync 408.

In this embodiment, it is assumed that two capacitors are used for 300a and two capacitors are used for 300b, but one skilled in the pertinent art will appreciate that different numbers and different combinations of numbers can be used depending on the application. Thus, the capacitor switching circuit 300 of the present invention can advantageously take the place and functions of the undamping and amplitude control circuits depicted in the prior art oscillator of FIG. 1.

Moreover, this embodiment of the present invention comprises two capacitor switching circuits, 300a and 300b, to replace the prior art capacitors, 104a and 104b. However, one skilled in the pertinent art will realize that the present invention is not limited to this configuration and that in some applications, only one capacitor switching circuit can be used.

When the energy losses per cycle of the oscillation are small enough, amplitude control of the oscillation can easily be accomplished in the architecture of the present invention by switching in a pre-charged, capacitor at a specific moment. In one embodiment, this specific moment can be easily determined by the oscillator itself, so the synchronization signal sync 408 can simply be derived from signals inside the oscillator. Thus, the present invention advantageously provides an oscillator with a simple design to control the amplitude, phase and frequency of the output waveforms.

Figure 5:
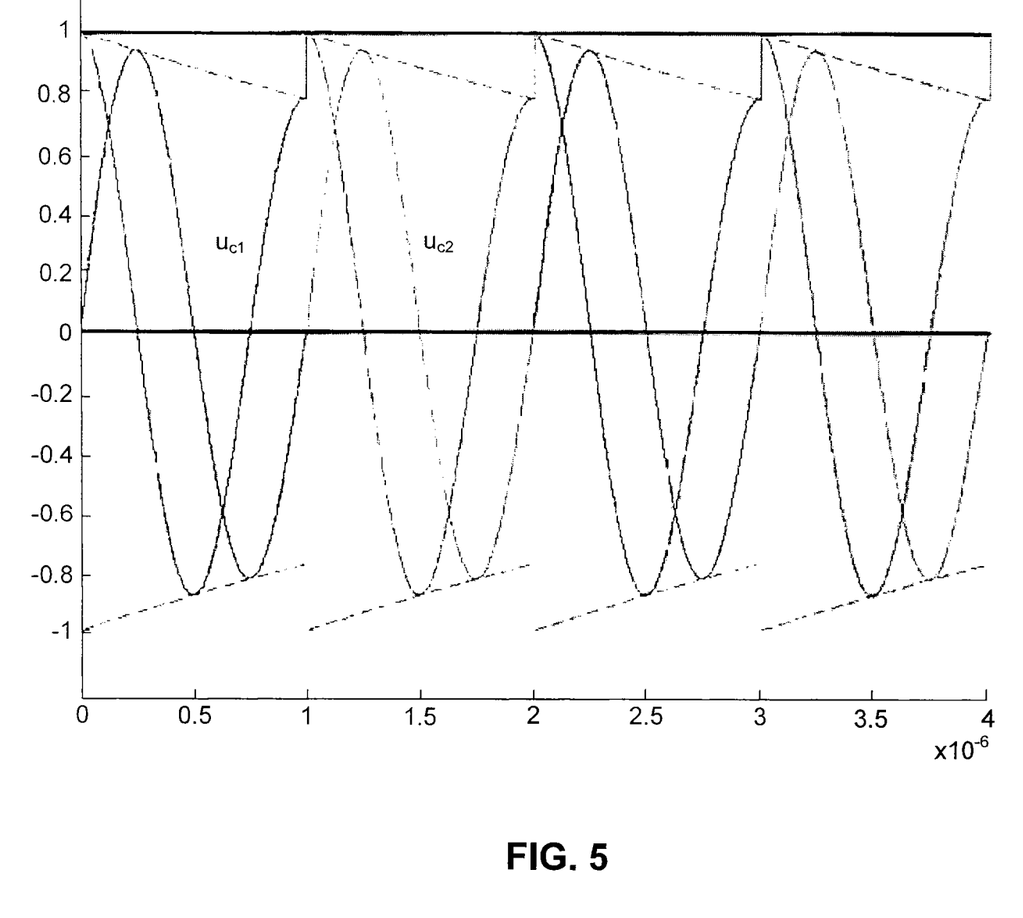
FIG. 5 illustrates possible waveforms of the oscillator in accordance with one embodiment of the present invention.

Referring now to FIG. 5, there is shown the possible waveforms that can exist in the present invention when two pre-charged capacitors are switched in once every cycle. After one cycle of the oscillation using $C_{1a}$, capacitor $C_{1b}$ is switched in precharged to a voltage of 1V. At the same time, $C_{1a}$ is switched out of the circuit to be precharged to 1V in order to be used the next cycle. At the same time $C_1$ is switched from $C_{1a}$ to $C_{1b}$, $C_2$ is switched from $C_{2a}$ to $C_{2b}$. At the zero crossing of $u_{c2}$, $C_{2b}$ is switched into the circuit precharged to a value of 0V, while $C_{2a}$ is taken out to be precharged to a value of 0V, in order to be used the next cycle.

Figure 6:
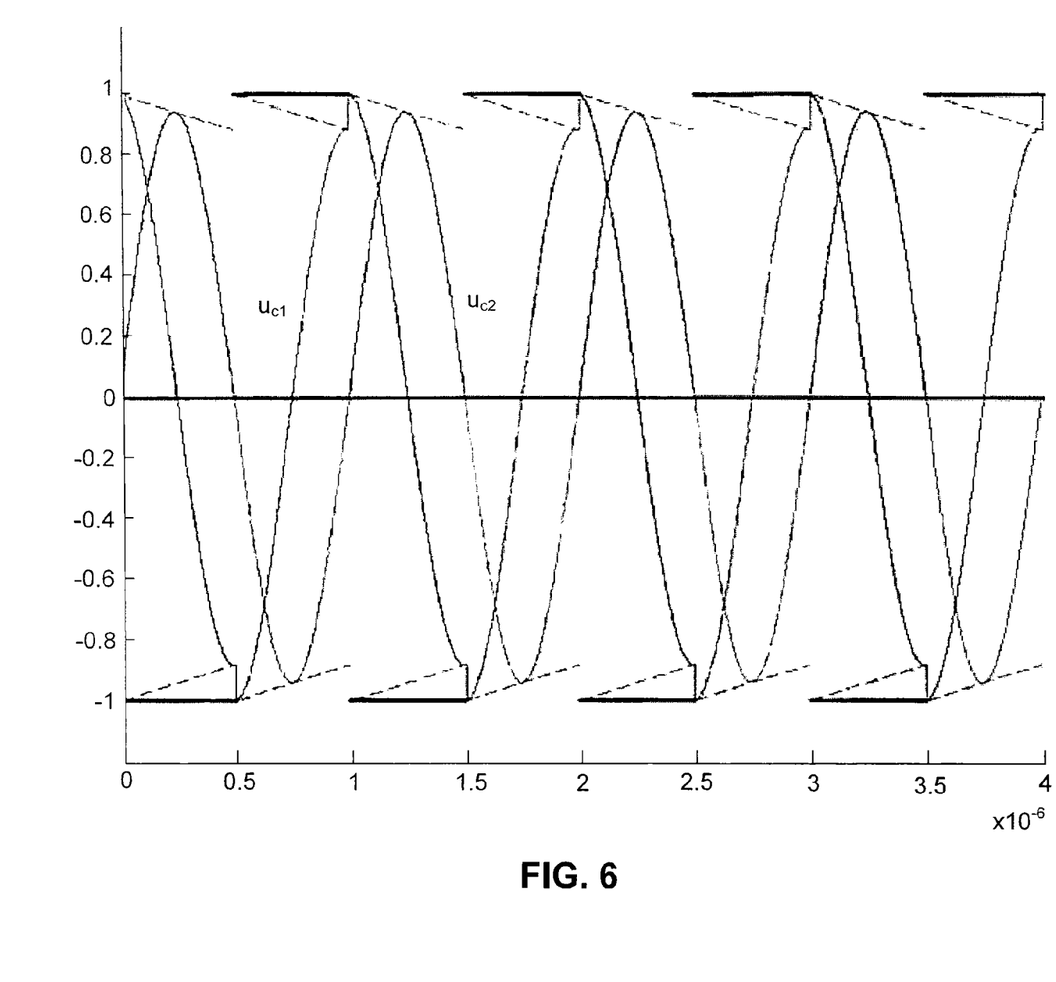
FIG. 6 illustrates possible waveforms of the oscillator in accordance with another embodiment of the present invention.

When refreshing of the charge is desired more than once per cycle, other implementations of the capacitor switching circuit 300 can be made, for example, when the losses inside the circuit are so high that refreshing the charge is necessary twice per cycle. Referring now to FIG. 6, there is shown another example of possible waveforms of the oscillator in accordance with another embodiment of the present invention. The oscillator architecture of the present invention is used in FIG. 6 with a slightly different synchronization signal. In this embodiment, the $C_1$ capacitors, 302a and 302b, are charged to 1V or −1V depending on the cycle, which can be done by the two sources depicted in FIG. 3 or using one source with a square wave output.

Also, the amplitude in the oscillation can be changed instantaneously by precharging the capacitors to the desired value and switching in the new capacitors at the desired moment. The moment of amplitude control can of course also be determined by an external timing reference.

Figure 7:
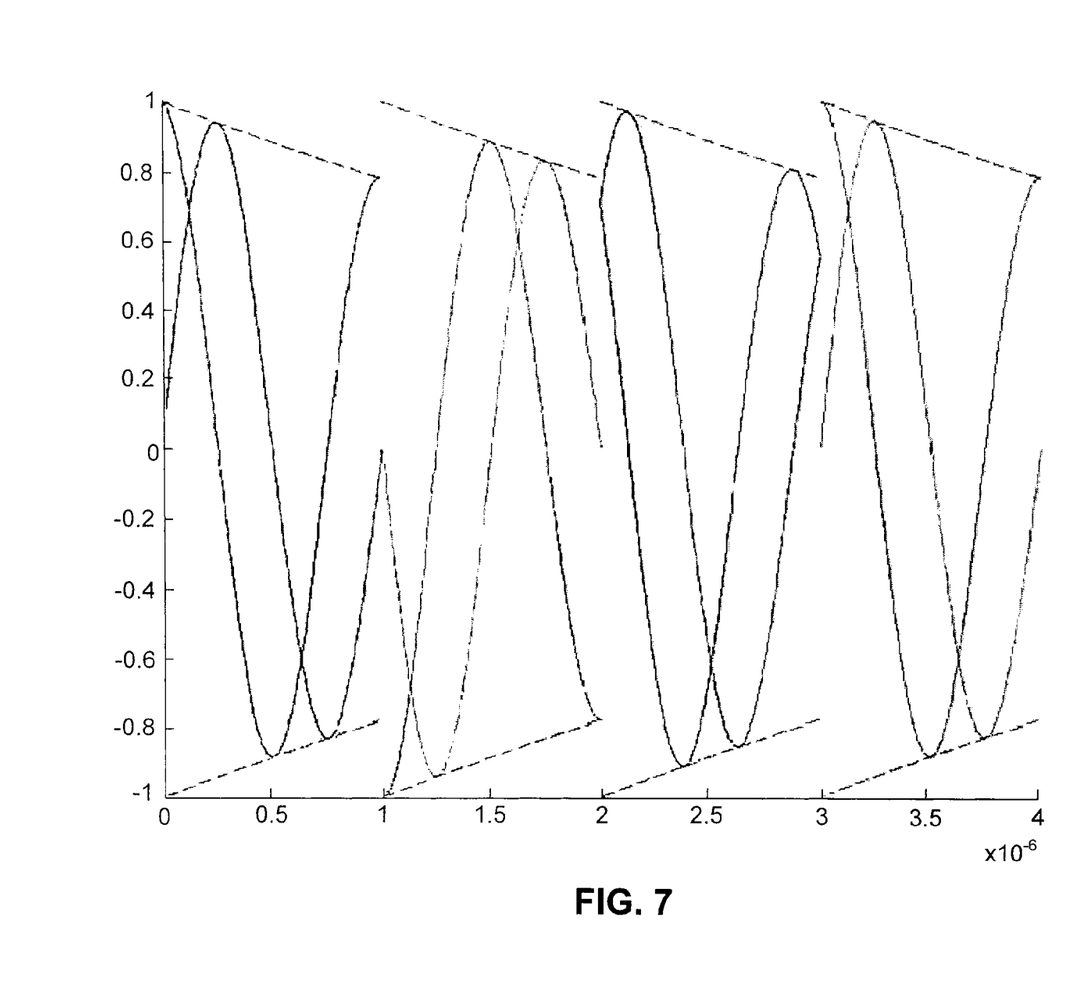
FIG. 7 illustrates phase control of the oscillator in accordance with one embodiment of the present invention.

Phase control is also possible in the oscillator architecture of the present invention. Referring now to FIG. 7, there is shown an example of phase control in the oscillator architecture in accordance with one embodiment of the present invention. In one embodiment, phase control is performed by changing the phase of the oscillation every 360 degrees of the original oscillation. One skilled in the pertinent art will realize that this is just one possible example of phase control and will appreciate that, in practice, phase can be changed to any desired phase at any desired moment by precharging the capacitors to the right voltage and switching them in and out at the desired moment. In this embodiment, the moment of phase control can be controlled by the oscillator itself or by any external timing reference.

Figure 8:
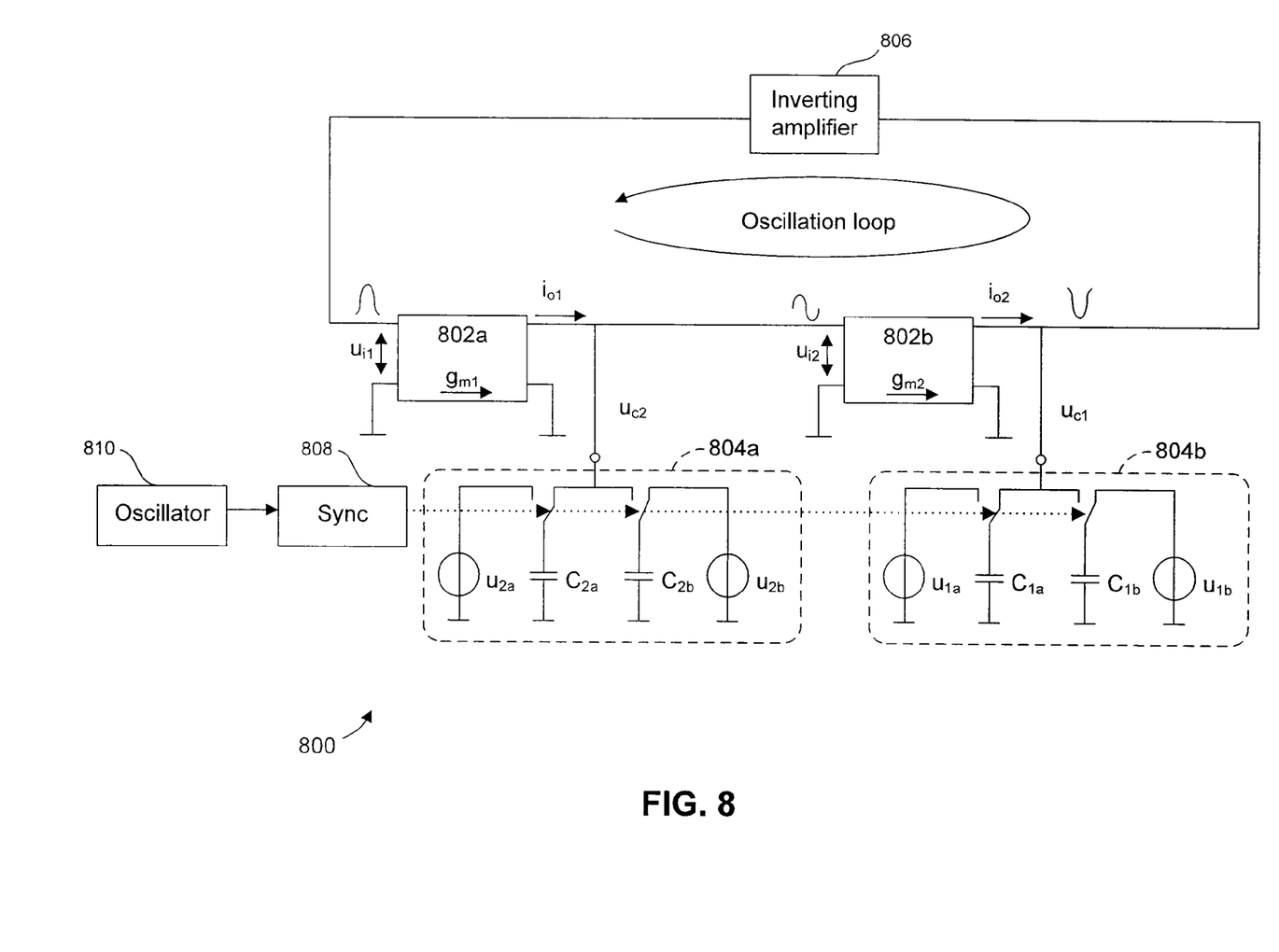
FIG. 8 is a simplified schematic of synchronization of the oscillator architecture with an external oscillation in accordance with one embodiment of the present invention.

Because phase is the integral of the frequency, frequency control is of course also possible in the oscillator architecture of the present invention. Referring now to FIG. 8, there is shown a modified two-integrator oscillator 800 in accordance with one embodiment of the present invention. The oscillator circuit 800 comprises a first and second transconductance amplifier, 802a and 802b, and a first and second capacitor switching circuit, 804a and 804b, coupled to an output of the first and second transconductance amplifiers, 802a and 802b. The circuit 800 also comprises an inverting amplifier 806 coupled to the transconductance amplifiers, 802a and 802b, and a synchronization signal sync 808 coupled to the capacitor switching circuits, 804a and 804b. The circuit 800 further comprises an external oscillator 810 coupled to the synchronization signal sync 808.

In this embodiment, the synchronization signal sync 808 is derived from the external oscillator 810, thus making the frequency of the modified two-integrator oscillator 800 equal to the externally injected signal. Thus, the external oscillator signal 810 of the present invention can now advantageously switch in and out the switched capacitors and thus force synchronization. The modified two-integrator oscillator of the present invention 800 will respond by making a phase hop just big enough to keep up with, or slow down to the external frequency.

Figure 9:
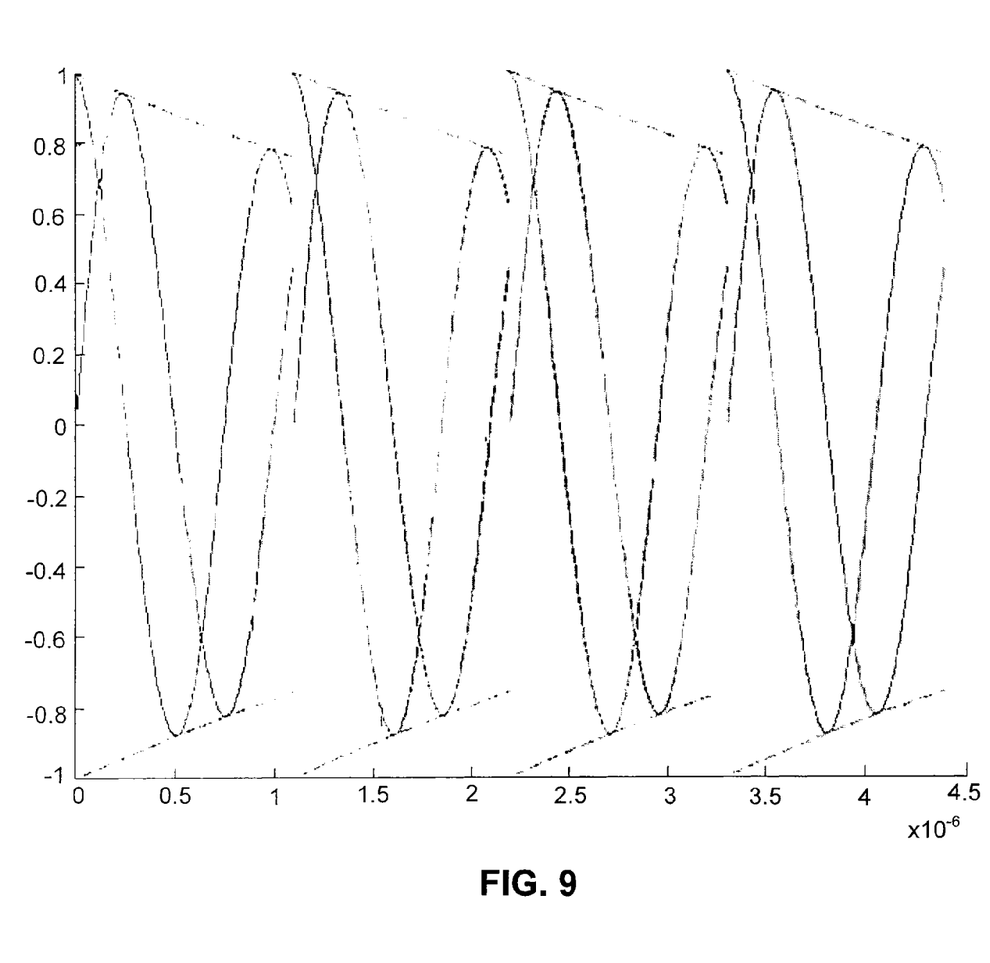
FIG. 9 illustrates the waveforms when the present invention is synchronized to an external frequency lower than its own oscillation frequency.

Referring now to FIG. 9, there are shown possible waveforms in which the modified two-integrator oscillator of FIG. 8 has a higher frequency than the frequency of the externally applied oscillation. In this embodiment, the oscillator is synchronized after it has already finished its period and the phase is reset to zero.

Figure 10:
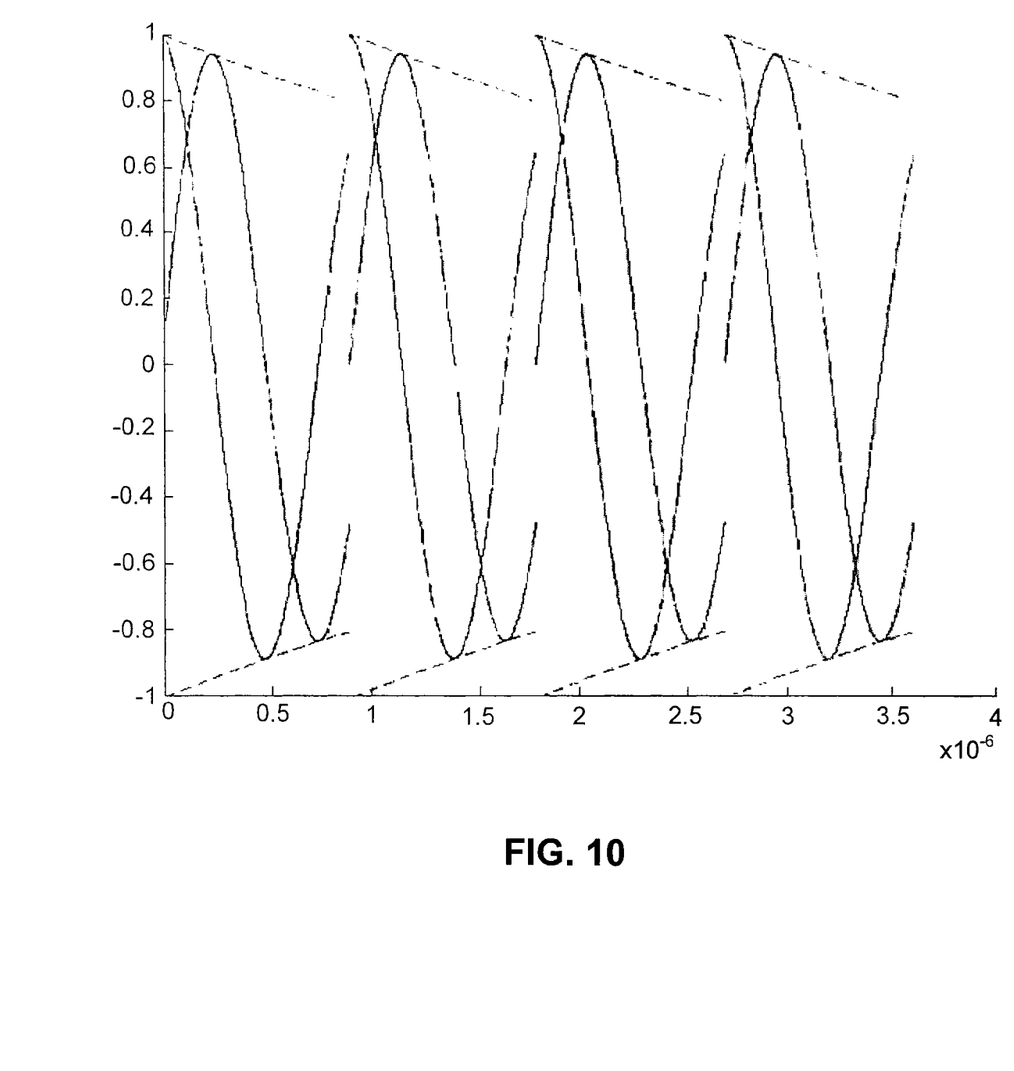
FIG. 10 illustrates the waveforms when the present invention is synchronized to an external frequency higher than its own oscillation frequency.

Referring now to FIG. 10, there are shown possible waveforms in which the modified two-integrator oscillator of FIG. 8 has a lower frequency than the frequency of the externally applied oscillation. In this embodiment, the oscillator can not completely finish its cycle before the phase is reset to zero by the externally applied synchronization signal.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. An oscillating circuit, comprising:
   an inverting amplifier;
   a transconductance amplifier coupled to the inverting amplifier; and
   a capacitor switching circuit, coupled to the transconductance amplifier, configured to switch an output of the transconductance amplifier between a first capacitor and a second capacitor, the capacitor switching circuit being further configured to charge the first capacitor when the second capacitor is switched to form part of an oscillation loop and to charge the second capacitor when the first capacitor is switched to form part of the oscillation loop,
   wherein the inverting amplifier, the transconductance amplifier, and the capacitor switching circuit are configured and arranged to form the oscillation loop.

2. The circuit of claim 1, further comprising:
   means for receiving a synchronization signal coupled to the capacitor switching circuit.

3. The circuit of claim 2, wherein the synchronization signal is derived from the oscillation loop.

4. The circuit of claim 2, wherein the synchronization signal is derived from an external oscillator.

5. The circuit of claim 1, wherein the capacitor switching circuit is further configured to switch the output of the transconductance amplifier between the first capacitor and the second capacitor in response to a synchronization signal.

6. The circuit of claim 5, wherein the capacitor switching circuit is further configured to control at least one of a group consisting of: an amplitude, a phase, and a frequency of the oscillation loop.

7. An oscillating circuit, comprising:
   an inverting amplifier;
   a transconductance amplifier coupled to the inverting amplifier;
   a capacitor switching circuit, coupled to the transconductance amplifier, configured to switch an output of the transconductance amplifier between a first capacitor and a second capacitor, the inverting amplifier, the transconductance amplifier, and the capacitor switching circuit being configured and arranged to form an oscillation loop;
   a first reference source coupled to the first capacitor; and
   a second reference source coupled to the second capacitor, wherein the capacitor switching circuit is further configured to charge the first capacitor to the first reference source when the second capacitor is switched to form part of the oscillation loop and to charge the second capacitor to the second reference source when the first capacitor is switched to form part of the oscillation loop.

8. The circuit of claim 7, wherein the first reference source is a signal reference source.

9. An oscillator circuit providing quadrature outputs and enabling control of at least one of a group consisting of: phase, frequency, and amplitude of the quadrature outputs, comprising:
   an inverting amplifier;
   a first and a second transconductance amplifier, wherein an input of the first transconductance amplifier is coupled to an output of the inverting amplifier and an output of the second transconductance amplifier is coupled to an input of the inverting amplifier; and
   a first capacitor switching circuit coupled to an output of the first transconductance amplifier, wherein the first capacitor switching circuit comprises:
      a first capacitor coupled to the output of the first transconductance amplifier, and
      a second capacitor coupled to the output of the first transconductance amplifier,
   wherein the first capacitor switching circuit is configured to switch the output of the first transconductance amplifier between the first capacitor and the second capacitor in response to a synchronization signal, the first capacitor switching circuit being further configured to charge the first capacitor when the second capacitor is switched to form part of an oscillation loop and to charge the second capacitor when the first capacitor is switched to form part of the oscillation loop, and
   wherein the inverting amplifier, the first transconductance amplifier, the second transconductance amplifier, and the first capacitor switching circuit are configured and arranged to form the oscillation loop.

10. The oscillator circuit of claim 9, further comprising:
    a second capacitor switching circuit coupled to the output of the second transconductance amplifier, wherein the oscillation loop further comprises:
    the second capacitor switching circuit.

11. The circuit of claim 9, wherein the first capacitor switching circuit controls at least one of a group consisting of: an amplitude, a phase, and a frequency of the oscillation loop.

12. The circuit of claim 9, further comprising:
    a reference source coupled to the first capacitor.

13. The circuit of claim 12, wherein the reference source is a signal reference source.

14. An oscillator circuit providing quadrature outputs and enabling control of at least one of a group consisting of: phase, frequency, and amplitude of the quadrature outputs, comprising:
    an inverting amplifier;
    a first and a second transconductance amplifier, wherein an input of the first transconductance amplifier is coupled to an output of the inverting amplifier and an output of the second transconductance amplifier is coupled to an input of the inverting amplifier; and
    a first capacitor switching circuit, coupled to an output of the first transconductance amplifier, configured to switch the output of the first transconductance amplifier between a first capacitor and a second capacitor, the first capacitor switching circuit being further configured to charge the first capacitor when the second capacitor is switched to form part of an oscillation loop and to charge the second capacitor when the first capacitor is switched to form part of the oscillation loop; and
    means for receiving a synchronization signal coupled to the first capacitor switching circuit,
    wherein the inverting amplifier, the first transconductance amplifier, the second transconductance amplifier, and the first capacitor switching circuit are configured and arranged to form the oscillation loop.

15. The oscillator circuit of claim 14, wherein the synchronization signal is derived internally.

16. The circuit of claim 14, wherein the synchronization signal is derived from an external oscillator.

17. The circuit of claim 14, wherein the first capacitor switching circuit is further configured to switch the output of the first transconductance amplifier between the first capacitor and the second capacitor in response to the synchronization signal.

18. An oscillator circuit providing quadrature outputs and enabling control over phase, frequency, and amplitude of the quadrature outputs, comprising:
    an oscillation loop;
    a first and a second transconductance amplifier coupled to the oscillation loop;
    a first capacitor switching circuit, coupled to an output of the first transconductance amplifier, configured to switch the output of the first transconductance amplifier between a first capacitor and a second capacitor, the first capacitor switching circuit being further configured to charge the first capacitor when the second capacitor is switched to form part of the oscillation loop and to charge the second capacitor when the first capacitor is switched to form part of the oscillation loop; and
    a means for receiving a synchronization signal having an output coupled to the first capacitor switching circuit, the synchronization signal being derived from an external oscillator.

19. The circuit of claim 18, wherein the first capacitor switching circuit is further configured to switch the output of the first transconductance amplifier between the first capacitor and the second capacitor in response to the synchronization signal.

* * * * *